United States Patent
Lee

(10) Patent No.: US 8,377,506 B2
(45) Date of Patent: Feb. 19, 2013

(54) METHOD OF MANUFACTURING A SUBSTRATE STRUCTURE

(75) Inventor: Chih-Cheng Lee, Banchiao (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 360 days.

(21) Appl. No.: 12/574,350

(22) Filed: Oct. 6, 2009

(65) Prior Publication Data

US 2010/0163287 A1 Jul. 1, 2010

(30) Foreign Application Priority Data

Dec. 29, 2008 (TW) .............................. 97151291 A

(51) Int. Cl.
*B05D 5/12* (2006.01)
*C25D 5/02* (2006.01)
*C23C 14/00* (2006.01)

(52) U.S. Cl. ............. 427/97.7; 427/96.9; 427/97.8; 427/97.9; 427/98.1; 205/125; 204/192.1

(58) Field of Classification Search ............. 427/96.9, 427/97.7, 97.8, 97.9, 98.1; 204/192.1; 205/125
See application file for complete search history.

(56) References Cited

U.S. PATENT DOCUMENTS

| | | | | |
|---|---|---|---|---|
| 4,988,582 A * | 1/1991 | Dyer | ............. | 429/495 |
| 5,361,491 A * | 11/1994 | Oomachi et al. | ............. | 29/852 |
| 6,174,647 B1 * | 1/2001 | Cahalen et al. | ............. | 430/315 |
| 6,376,049 B1 * | 4/2002 | Asai et al. | ............. | 428/209 |
| 6,609,297 B1 * | 8/2003 | Hiramatsu et al. | ............. | 29/852 |
| 6,864,577 B2 * | 3/2005 | Clatanoff et al. | ............. | 257/737 |
| 7,336,032 B2 * | 2/2008 | Cho et al. | ............. | 313/582 |
| 2002/0058412 A1 * | 5/2002 | Ono et al. | ............. | 438/678 |
| 2007/0281390 A1 | 12/2007 | Kang | | |

* cited by examiner

*Primary Examiner* — Brian K Talbot
(74) *Attorney, Agent, or Firm* — Muncy, Geissler, Olds & Lowe, PLLC

(57) ABSTRACT

A substrate structure is provided. The substrate structure includes a substrate, a first insulation layer, a conductive part, a second insulation layer, a seed layer and a conductive layer. The substrate has a first circuit pattern layer and a second circuit pattern layer, which are located on two opposite surfaces of the substrate respectively. The first insulation layer formed on the first circuit pattern layer has a first insulation hole, which exposes a first opening in the outer surface of the first insulation layer. The conductive part formed on the first insulation hole for electrically connecting with a chip is enclosed by the edge of the first opening. The second insulation layer formed on the second circuit pattern layer has a second insulation hole in which the seed layer is formed. The conductive layer is formed on the seed layer for electrically connecting with a circuit board.

12 Claims, 5 Drawing Sheets

METHOD OF MANUFACTURING A SUBSTRATE STRUCTURE

This application claims the benefit of Taiwan application Serial No. 97151291, filed Dec. 29, 2008, the subject matter of which is incorporated herein by reference.

BACKGROUND OF THE INVENTION

1. Field of the Invention

The invention relates in general to a substrate structure and a manufacturing method thereof, and more particularly to a substrate structure applicable to a flip chip and a manufacturing method thereof.

2. Description of the Related Art

Referring to FIG. 1A, a generally known substrate structure is shown. The generally known substrate structure, such as the substrate structure 100 applicable to flip chip, has a substrate 116, a conductive part 102 and an insulation layer 104. The conductive part 102 is for electrically connecting with a chip (not illustrated) such as a flip chip. A part of the conductive part 102 contacts the insulation layer 104 such as a solder mask. The dry film 106 of FIG. 1A is for defining the range of the conductive part 102, is formed prior to the formation of the conductive part 102 and then is removed after the formation of the conductive part 102 so as to form the substrate structure 100. A mask is used during the formation of the dry film 106 for defining the range of the dry film 106.

The conductive part 102 is composed of a material such as tin-lead alloy different from that of the insulation layer 104. As the coefficient of thermal expansion is different for different materials, a crack C may easily occur to the contact surface P between the conductive part 102 and the dry film 106 so that the conductive part 102 is damaged due to the phenomenon of expansion and contraction during the manufacturing of the substrate structure 100 or when the substrate structure 100 is on work.

Besides, referring to FIG. 1B, the alignment mismatch of a dry film of FIG. 1A is shown. As the mask requires precise alignment match, if the shift in alignment match is too big, shift problem as indicated in FIG. 1B will occur to the dry film 106. Thus, the formation of the conductive part in subsequent process will be affected so that shift problem will occur to the conductive part as well.

Referring to FIG. 1C, another implementation of the generally known substrate structure is shown. The generally known substrate structure 108 has a tin ball 110, an insulation layer 118. As the corner 114 of a hole 112 has a large surface tension, the tin ball 110 of the substrate structure 108 cannot completely fill the corner 114, and the quality of electrical connection of the tin ball 110 will deteriorate.

SUMMARY OF THE INVENTION

The invention is directed to a substrate structure and a manufacturing method thereof. The conductive part of the substrate structure completely fills the corner of the hole, so that the quality of electrical connection of the conductive part is improved.

According to a first aspect of the invention, a substrate structure including a substrate, a first insulation layer, a conductive part, a second insulation layer, a first seed layer and a conductive layer is provided. The substrate has a first circuit pattern layer and a second circuit pattern layer, which are located on two opposite surfaces of the substrate respectively. The first insulation layer formed on the first circuit pattern layer has a first insulation hole, which exposes a first opening in the outer surface of the first insulation layer. The conductive part formed on the first insulation hole for electrically connecting with a chip is enclosed by the edge of the first opening. The second insulation layer formed on the second circuit pattern layer has a second insulation hole in which the seed layer is formed. The conductive layer is formed on the seed layer for electrically connecting with a circuit board.

According to a second aspect of the invention, a method of manufacturing substrate structure is provided. The method includes the following steps. A substrate having a first circuit pattern layer and a second circuit pattern layer, which are located on two opposite surfaces of the substrate respectively, is provided. A first insulation layer is formed on the first circuit pattern layer, wherein the first insulation layer has a first insulation hole, which exposes a first opening in the outer surface of the first insulation layer and exposes a part of the first circuit pattern layer. A second insulation layer is formed on the second circuit pattern layer, wherein the second insulation layer has a second insulation hole. A first seed layer is formed on the second insulation layer and a second seed layer is simultaneously formed on the first insulation layer. The second seed layer is removed. A conductive part is formed on the first insulation hole and a conductive layer is simultaneously formed on the first seed layer, wherein the conductive part for electrically connecting with a chip is enclosed by the edge of the first opening, and the exposed part of the first circuit pattern layer contacts the conductive part. The conductive layer is for electrically connecting with a circuit board.

The invention will become apparent from the following detailed description of the preferred but non-limiting embodiments. The following description is made with reference to the accompanying drawings.

DETAILED DESCRIPTION OF THE INVENTION

Figure 2:
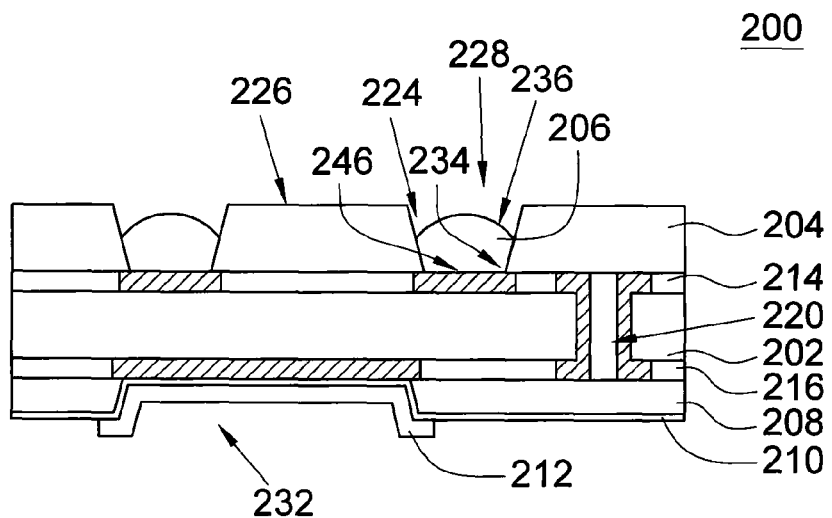
FIG. 2 shows a substrate structure according to a preferred embodiment of the invention.

Referring to FIG. 2, a substrate structure according to a preferred embodiment of the invention is shown. The present embodiment of the invention is exemplified by a substrate structure 100 applicable to flip chip. The substrate structure 200 includes a substrate 202, a first insulation layer 204, a conductive part 206, a second insulation layer 208, a first seed layer 210 and a conductive layer 212.

The substrate 202 has a first circuit pattern layer 214 and a second circuit pattern layer 216, which are located on two opposite surfaces of the substrate 202. The substrate 202 further has a via hole 220 through which the first circuit pattern layer 214 and the second circuit pattern layer 216 are electrically connected. Besides, the first insulation layer 204, such as a solder mask, is formed on the first circuit pattern layer 214. The first insulation layer 204 has a first insulation hole 224 which exposes a first opening 228 on the outer surface 226 of the first insulation layer 204 and exposes a part 246 of the first circuit pattern layer 214.

Despite the substrate 202 of the present embodiment of the invention has two layers of circuit pattern layer, that is, the first circuit pattern layer 214 and the second circuit pattern layer 216, the invention is not limited thereto, and the substrate 202 can be a multi-layered structure which has more than two layers of circuit pattern.

The second insulation layer 208, such as a solder mask, is formed on the second circuit pattern layer 216, and the second insulation layer 208 has a second insulation hole 232 in which the first seed layer 210 is formed. In the present embodiment of the invention, the substrate structure 200 only has one seed layer, that is, the first seed layer 210, disposed at one side of the substrate 202. The conductive layer 212 is formed on the first seed layer 210 for electrically connecting with a circuit board (not illustrated).

The conductive part 206 is formed on the first insulation layer 204 for electrically connecting with a chip (not illustrated), the exposed part 246 of the first circuit pattern layer 214 completely contacts the conductive part 206. As indicated in FIG. 2, that the conductive part 206 completely fills the corner 234 of the first opening 228 is conducive to the quality of electrical connection. Besides, the outer surface 236 of the conductive part 206 is a camber surface and is lower than the first opening 228, but is not for limiting the height of the conductive part 206 of the invention. The outer surface 236 of the conductive part 206 can be equal to or protruded from the first opening 228.

Figure 1A:
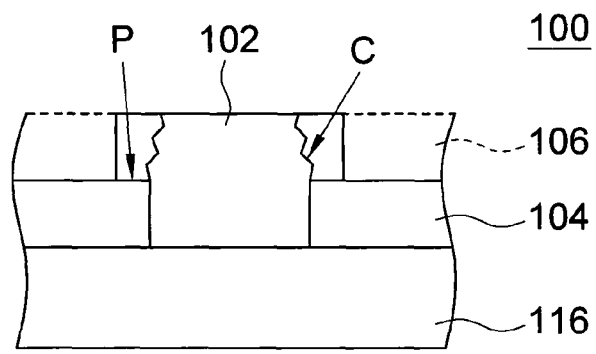
FIG. 1A shows a generally known substrate structure.
Figure 1B:
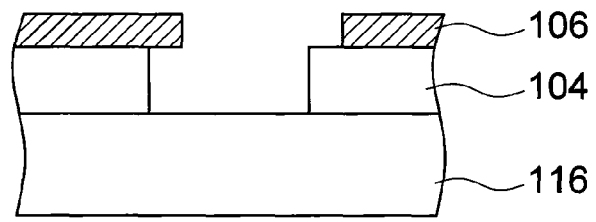
FIG. 1B shows the alignment mismatch of a dry film of FIG. 1A.
Figure 1C:
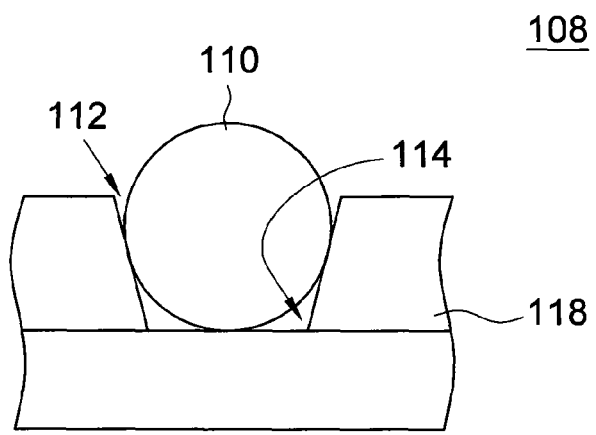
FIG. 1C shows another implementation of the generally known substrate structure.

Besides, as indicated in FIG. 2, the conductive part 206 is formed in the first opening 228 and does not contact the outer surface 226 of the first insulation layer 204. Furthermore, referring to FIG. 3, a top view of a part of the substrate structure of FIG. 2 is shown. The conductive part 206 of the present embodiment of the invention is enclosed by the edge 230 of the first opening 228 and does not contact the outer surface 226 of the first insulation layer 204. Thus, the crack C as indicated in FIG. 1A will not occur to the conductive part 206 of the present embodiment of the invention.

Figure 3:
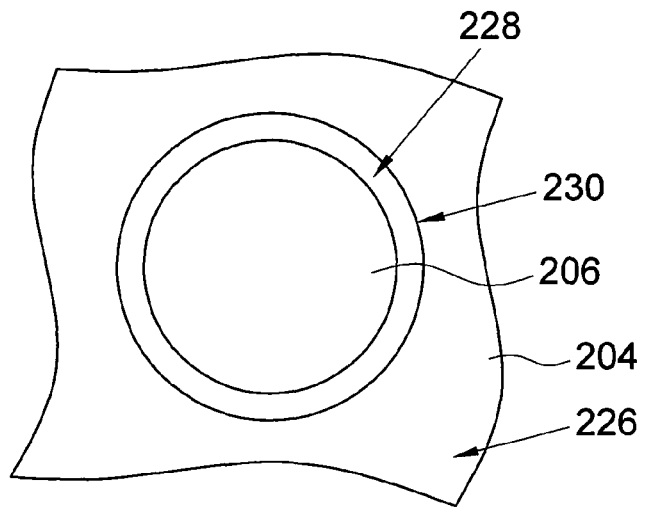
FIG. 3 shows a top view of a part of the substrate structure of FIG. 2.
Figure 4:
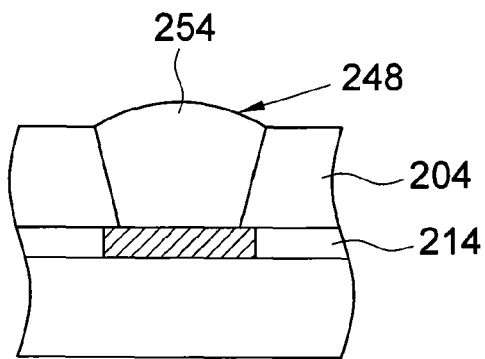
FIG. 4 shows a conductive part of a substrate structure of another embodiment.

Besides, referring to FIG. 4, a conductive part of a substrate structure of another embodiment is shown. The outer surface of 248 of the conductive part 254 is protruded from the first opening 228 (illustrated in FIG. 2) and the conductive 254 exactly contacts the edge 230 (illustrated in FIG. 3) of the first opening 228. Thus, the conductive part 254 does not contact the outer surface 226 of the first insulation layer 204, and the crack C as indicated in FIG. 1A will not occur either.

Besides, the conductive part 206 can be composed of different types of conductive materials such as gold, silver, nickel, palladium, tin or copper. The conductive layer 212 is composed of the same material with that of the conductive part 206.

Figure 5:
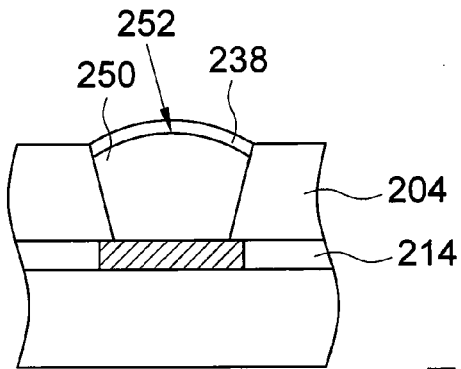
FIG. 5 shows the conductive part on which a protection layer is formed in another embodiment.

Besides, referring to FIG. 5, the conductive part on which a protection layer is formed in another embodiment is shown. In another embodiment, the outer surface 252 of the conductive part 250 can form a protection layer 238 for protecting the conductive part 250 and improving the quality of electrical connection of the conductive part 250. The protection layer is composed of gold, silver, nickel, palladium, organic solderability preservative (OSP), electroless Ni & immersion gold (ENIG), electroless Ni/Pd & immersion gold (ENEPIG) or tin.

Figure 6:
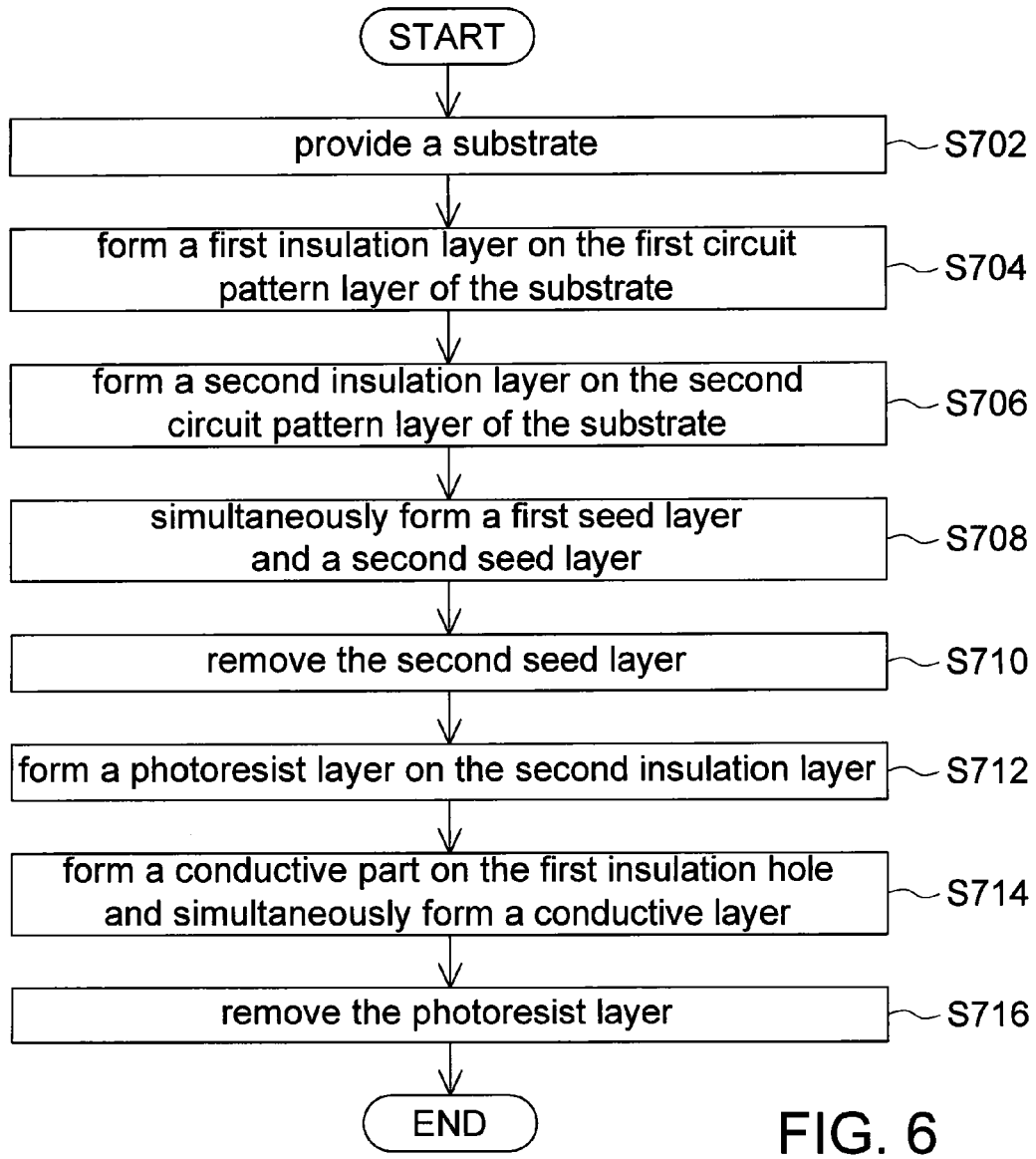
FIG. 6 shows a flowchart of a method of manufacturing substrate structure according to a preferred embodiment of the invention.

A method of manufacturing substrate structure according to a preferred embodiment of the invention is disclosed below. Referring to FIG. 6, a flowchart of a method of manufacturing substrate structure according to a preferred embodiment of the invention is shown. The manufacturing method includes the following steps.

Figure 7A:
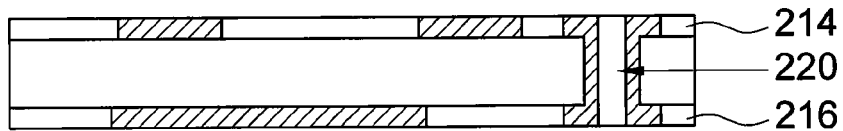
FIG. 7A shows a substrate of the present embodiment of the invention.

Firstly, referring to FIG. 7A, a substrate of the present embodiment of the invention is shown. In step S702, a substrate 202 is provided, wherein the substrate 202 has a first circuit pattern layer 214 and a second circuit pattern layer 216, which are located on two opposite surfaces of the substrate 202. The substrate 202 further has a via hole 220 through which the first circuit pattern layer 214 and the second circuit pattern layer 216 are electrically connected.

Figure 7B:
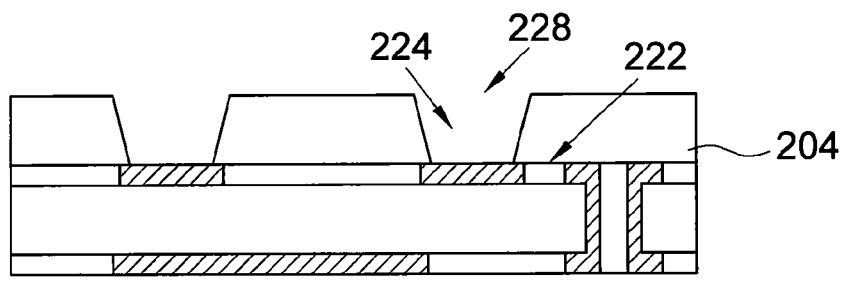
FIG. 7B shows the substrate of FIG. 7A having a first insulation layer formed thereon.

Next, referring to FIG. 7B, the substrate of FIG. 7A having a first insulation layer formed thereon is shown. In step S704, a first insulation layer 204 is formed on the first circuit pattern layer 214, wherein the first insulation layer 204 has a first insulation hole 224, which exposes the first opening 228 on the outer surface 226 of the first insulation layer 204.

Figure 7C:
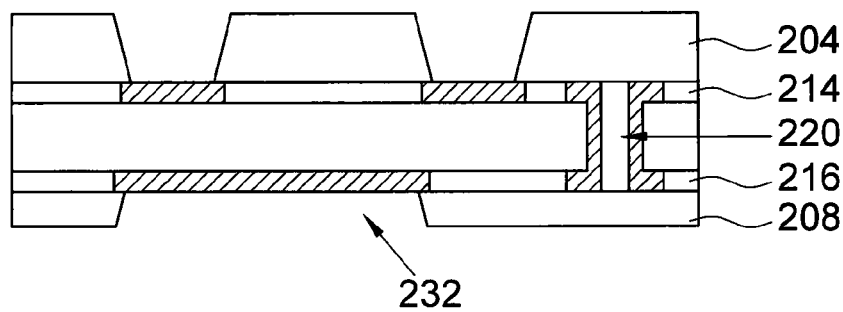
FIG. 7C shows the substrate of FIG. 7B having a second insulation layer formed thereon.

After that, referring to FIG. 7C, a substrate of FIG. 7C having a first seed layer and a second seed layer formed thereon is shown. In step S706, the second insulation layer 208 is formed on the second circuit pattern layer 216, the second insulation layer 208 has the second insulation hole 232.

Figure 7D:
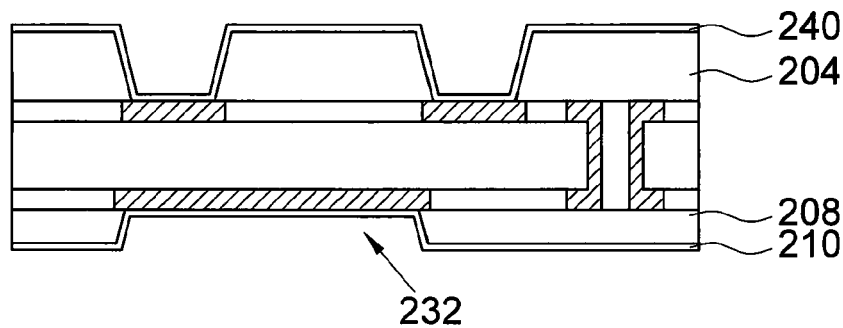
FIG. 7D shows a substrate of FIG. 7C having a first seed layer and a second seed layer formed thereon.

Then, referring to FIG. 7D, a substrate of FIG. 7C having a first seed layer and a second seed layer formed thereon is shown. In step S708, the first seed layer 210 is formed on the second insulation layer 208 and a second seed layer 240 is simultaneously formed on the first insulation layer 204. The first seed layer 210 and the second seed layer 240 can be formed by way of electroless plating or sputtering for example.

Figure 7E:
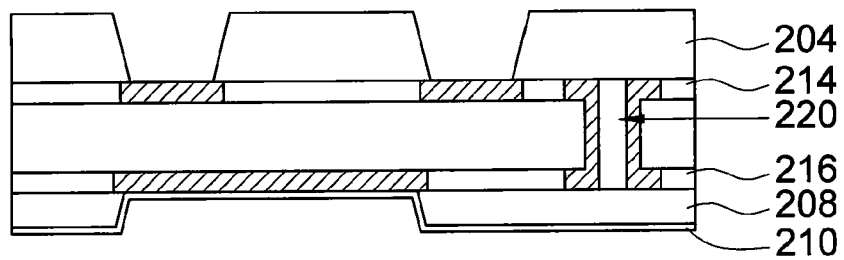
FIG. 7E shows the substrate of FIG. 7D with the second seed layer being removed.

Then, referring to FIG. 7E, the substrate of FIG. 7D with the second seed layer being removed is shown. In step S710, the second seed layer 240 is removed by way of etching, such as wet etching or dry etching. Thus, the substrate structure 200 of the present embodiment of the invention only has one seed layer, that is, the first seed layer 210, on one side of the substrate 202, and there is no seed layer at on the other side of the substrate 202.

Figure 7F:
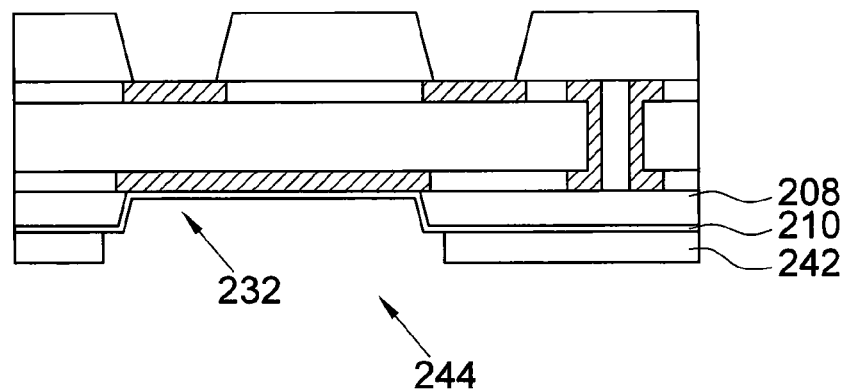
FIG. 7F shows the substrate of FIG. 7E having a photoresist layer formed thereon.

Then, referring to FIG. 7F, the substrate of FIG. 7E having a photoresist layer formed thereon is shown. In step S712, a photoresist layer 242, such as a dry film, is formed on the second insulation layer 208. The photoresist layer 242 has a second opening 244, which exposes the second insulation hole 232.

Figure 7G:
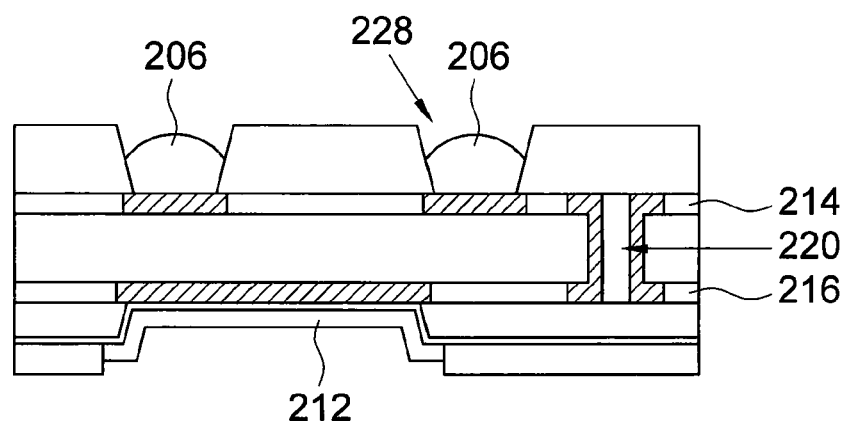
FIG. 7G shows the substrate of FIG. 7F having a conductive part and a conductive layer formed thereon.

Then, referring to FIG. 7G, the substrate of FIG. 7F having a conductive part and a conductive layer formed thereon is shown. In step S714, a conductive part 206 is formed on the first insulation hole 224 and the conductive layer 212 is simultaneously formed on the second insulation hole 232. The conductive part 206 is used for electrically connecting with chip and is enclosed by the edge of the first opening 228, as indicated in FIG. 3. The conductive layer 212 is used for electrically connecting with the circuit board. The step of forming the conductive part 206 and the conductive layer 212 can be achieved by way of electro plating or chemical deposition.

As the first circuit pattern layer 214 is electrically connected with the second circuit pattern layer 216 through the via hole 220. Presuming that electro plating is adopted. When the electrode of the electro-plating facility is electrically connected with the first seed layer 210, the first circuit pattern layer 214 is electrically connected with the second circuit pattern layer 216 at the same time, so that the conductive part 206 and the conductive layer 212 are simultaneously formed. That is, the conductive part 206 is composed of the same material with that of the conductive layer 212. The conductive part 206 is composed of gold, silver, nickel, palladium, tin or copper.

Besides, the conductive part 206 and the conductive layer 212 can be composed of several different materials including some inexpensive metals such as copper. Compared with the generally known technology which adopts tin-lead alloy, the conductive part 206 and the conductive layer 212 of the present embodiment of the invention indeed bring down the cost significantly.

In the present step, the height of the conductive part 206 can be controlled by way of controlling manufacturing parameters such as electro-plating time, current or voltage for the height of the conductive part to be as indicated in FIG. 2 or FIG. 4. As indicated in FIG. 2, the outer surface 236 of the conductive part 206 is lower than the outer surface 226 of the first insulation layer 204. Or, as indicated in FIG. 4, the conductive part 254 exactly contacts the edge 230 (illustrated in FIG. 3) of the first opening 228 (illustrated in FIG. 2), so that the outer surface 236 of the conductive part 206 is protruded from the first opening 228.

Besides, as the second seed layer 240 is already moved and the electro-plated electrode is only electrically connected with the first seed layer 210, the conductive part 206 is gradually protruded so that the outer surface 236 of the conductive part 206 forms a camber surface. As the highest point of the camber surface is located at the middle position, chip can be precisely aligned, and the quality of electrical connection is improved.

The conductive part 206 is formed in the first insulation hole 224 by way of electro plating or chemical deposition which does not require the mask, so the shift problem caused by the alignment mismatch of mask will not occur. That is, shift problem does not occur to the conductive part 206 of the present embodiment of the invention.

Besides, as indicated in FIG. 5, after step S714, the protection layer 238 can be formed on the outer surface 236 of the conductive part 206 of FIG. 7G to protect the conductive part 206. The protection layer is composed of gold, silver, nickel, palladium, organic solderability preservative, electroless Ni & immersion gold, electroless Ni/Pd & immersion gold or tin.

Then, in step S716, the photoresist layer 242 is removed. Here, the substrate structure 200 as indicated in FIG. 2 is formed. The step of removing the photoresist layer 242 is achieved by way of etching, stripping.

The substrate structure and the manufacturing method thereof disclosed in the above embodiments of the invention have many advantages exemplified below.

(1). The conductive part completely fills the corner of the first opening, hence improving the quality of electrical connection.

(2). That the outer surface of the conductive part is a camber surface whose highest point is located at the middle position makes the chip precisely aligned and improves the quality of electrical connection.

(3). The process of forming the conductive part does not use the mask so there is no need to align the mask, so that shift problem will not occur to the conductive part of the invention.

(4). The conductive part and the conductive layer can be composed of inexpensive metals such as copper. Compared with the tin-lead alloy adopted in the generally known technology, material cost of the invention is much cheaper.

(5). A protection layer can be formed on the outer surface of the conductive part to protect the conductive part or improve the quality of electrical connection of the conductive part. The protection layer can be composed of different types of materials such as gold, silver, nickel, palladium, organic solderability preservative, electroless Ni & immersion gold, electroless Ni/Pd & immersion gold or tin.

(6). The conductive part does not contact the outer surface of the first insulation layer, hence avoiding expansion and contraction. The crack C as indicated in FIG. 1A will not occur to the conductive part of the invention.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of manufacturing substrate structure, comprising:
    providing a substrate, wherein the substrate having a first circuit pattern layer and a second circuit pattern layer is formed on two opposite surfaces of the substrate respectively;
    forming a first insulation layer on the first circuit pattern layer, wherein the first insulation layer has a first insulation hole, which exposes a first opening in the outer surface of the first insulation layer and exposes a part of the first circuit pattern layer;
    forming a second insulation layer on the second circuit pattern layer, wherein the second insulation layer has a second insulation hole;
    forming a first seed layer on the second insulation layer and simultaneously forming a second seed layer on the first insulation layer;
    completely removing the second seed layer; and
    after removing the second seed layer, forming a conductive part on the first insulation hole and simultaneously forming a conductive layer on the first seed layer, wherein the conductive part for electrically connecting with a chip is enclosed by the edge of the first opening, the part of the first circuit pattern layer contacts the conductive part, and the conductive layer is used for electrically connecting with a circuit board.

2. The method according to claim 1, wherein after the step of removing the second seed layer, the method further comprises:

forming a photoresist layer on the second insulation layer, wherein the photoresist layer has a second opening, which exposes the second insulation hole.

3. The method according to claim 2, wherein after the step of simultaneously forming the conductive part and the conductive layer, the method further comprises:

removing the photoresist layer.

4. The method according to claim 3, wherein the photoresist layer is a dry film, and the step of removing the photoresist layer is achieved by way of etching or stripping.

5. The method according to claim 1, wherein the step of simultaneously forming the conductive part and the conductive layer is achieved by way of electro plating.

6. The method according to claim 1, wherein the step of simultaneously forming the conductive part and the conductive layer is achieved by way of chemical deposition.

7. The method according to claim 1, wherein the step of simultaneously forming the first seed layer and the second seed layer is achieved by way of electroless plating or sputtering.

8. The method according to claim 1, wherein the step of removing the second seed layer is achieved by way of etching.

9. The method according to claim 1, wherein the outer surface of the conductive part is lower than the first opening.

10. The method according to claim 1, wherein the outer surface of the conductive part is a camber surface.

11. The method according to claim 1, wherein after the step of simultaneously forming the conductive part and the conductive layer, the method further comprises:

forming a protection layer on the outer surface of the conductive part for protecting the conductive part.

12. The method according to claim 11, wherein the protection layer is made of gold, silver, nickel, palladium, organic solderability preservative, electroless Ni & immersion gold, electroless Ni/Pd & immersion gold or tin.

* * * * *